(12) United States Patent
Lee

(10) Patent No.: US 7,893,504 B2
(45) Date of Patent: Feb. 22, 2011

(54) NON-VOLATILE SEMICONDUCTOR MEMORY DEVICE WITH CONTACT PLUG ELECTRICALLY CONDUCTIVE IN RESPONSE TO LIGHT

(75) Inventor: Yong-Geun Lee, Eumseong-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/476,367

(22) Filed: Jun. 2, 2009

(65) Prior Publication Data

US 2009/0294862 A1 Dec. 3, 2009

(30) Foreign Application Priority Data

Jun. 3, 2008 (KR) .................. 10-2008-0052038

(51) Int. Cl.
*H01L 21/70* (2006.01)
*H01L 29/06* (2006.01)
*H01L 29/66* (2006.01)
*H01L 21/02* (2006.01)
*H01L 27/088* (2006.01)

(52) U.S. Cl. .................. 257/390; 257/202; 257/327; 257/335; 257/336; 257/343; 257/344; 257/365; 257/401; 257/408; 257/900; 257/E21.421; 257/E21.626; 257/E21.64

(58) Field of Classification Search .................. 257/202, 257/327, 335–336, 343–344, 365, 390, 401, 257/408, 900, E21.421, E21.626, E21.64
See application file for complete search history.

(56) References Cited

U.S. PATENT DOCUMENTS

| | | | |
|---|---|---|---|
| 5,554,869 A * | 9/1996 | Chang | 257/316 |
| 5,831,319 A * | 11/1998 | Pan | 257/408 |
| 6,383,882 B1 * | 5/2002 | Lee et al. | 438/303 |
| 6,833,575 B2 * | 12/2004 | Parekh et al. | 257/296 |
| 7,397,092 B2 * | 7/2008 | Horii et al. | 257/379 |
| 7,411,208 B2 * | 8/2008 | Hwang et al. | 257/4 |
| 7,482,616 B2 * | 1/2009 | Song et al. | 257/2 |
| 7,586,774 B2 * | 9/2009 | Joo et al. | 365/145 |
| 7,605,079 B2 * | 10/2009 | Lai et al. | 438/666 |
| 7,692,253 B2 * | 4/2010 | Taguchi | 257/401 |
| 2002/0024001 A1 * | 2/2002 | Hiyama et al. | 250/208.1 |
| 2003/0139031 A1 * | 7/2003 | Fukada et al. | 438/622 |
| 2004/0046211 A1 * | 3/2004 | Shimotsusa et al. | 257/368 |
| 2005/0045915 A1 * | 3/2005 | Lee | 257/202 |
| 2006/0215070 A1 * | 9/2006 | Taniguchi et al. | 349/43 |
| 2007/0210334 A1 * | 9/2007 | Lim et al. | 257/200 |
| 2008/0122804 A1 * | 5/2008 | Kinoshita et al. | 345/175 |

* cited by examiner

*Primary Examiner*—Ida M Soward
(74) *Attorney, Agent, or Firm*—Sherr & Vaughn, PLLC

(57) ABSTRACT

Disclosed are a non-volatile semiconductor memory device capable of simplifying the complicated structure of a transistor, and a fabrication method for the same. The non-volatile semiconductor memory device includes a semiconductor substrate including a plurality of active regions, gate electrodes formed over the respective active regions of the semiconductor substrate, gate spacers formed over both sides of each of the gate electrodes, common source/drain regions formed on the surface of the semiconductor substrate at both sides of the gate electrode including the gate spacers, an interlayer dielectric formed over the whole surface of a resultant structure including the substrate, gate electrodes, gate spacers and common source/drain regions, and contact plugs penetrating the interlayer dielectric, and connecting the common source/drain regions to a data line, wherein the contact plugs are made from a material which becomes electrically conductive when in contact with light and becomes nonconductive when out of contact with light.

10 Claims, 4 Drawing Sheets

NON-VOLATILE SEMICONDUCTOR MEMORY DEVICE WITH CONTACT PLUG ELECTRICALLY CONDUCTIVE IN RESPONSE TO LIGHT

The present application claims priority under 35 U.S.C. 119 to Korean Patent Application No. 10-2008-0052038 (filed on Jun. 3, 2008), which is hereby incorporated by reference in its entirety.

BACKGROUND

Semiconductor memory devices may be classified into read access memory (RAM) types, such as a dynamic RAM (DRAM) and a static RAM (SRAM), and read only memory (ROM) types. RAM has relatively fast data input/output performance and volatility that loses data as time passes while ROM has relatively slow data input/output performance and non-volatility that retains data once input. The ROM types include ROM, programmable ROM (PROM), erasable PROM (EPROM), and electrically erasable PROM (EEPROM). Among the ROM types, the demand for the EEPROM that is electrically programmable or erasable has been increasing.

A flash memory cell capable of simultaneous erasing in the same manner as the EEPROM has a stacked floating gate and control gate. Such flash memory cells are widely used in notebook computers, PDAs, computer basic input/output systems (BIOS), printers and the like.

In view of the circuit structure, flash memory cells may be classified into a NAND type and a NOR type. NAND flash memory cells include n-number of cell transistors serially connected, forming a unit string. Since the unit strings are connected in parallel between a bit line and a ground line, it becomes easier to achieve high integration. In NOR flash memory cells, since the cell transistors are connected in parallel between the bit line and the ground line, the operation speed is high.

The structure and the operation of a related NOR flash memory cell will now be explained with reference to FIG. 1 and FIG. 2. FIG. 1 is an equivalent circuit view of a flash memory cell array and FIG. 2 is a longitudinal sectional view of a unit cell shown in FIG. 1.

Referring to FIG. 1, the flash memory cell includes a plurality of word lines W/L and a plurality of bit lines B/L crossing each other, and a plurality of memory cells MC connected between the word lines and the bit lines. Source regions of the respective memory cells MC are connected to a common source line CSL.

The structure of the memory cell MC is illustrated in FIG. 2. A tunnel oxide layer 11 is formed between a floating gate 12 and a semiconductor substrate 10. An interlayer dielectric 13 having a high-k dielectric oxide-nitride-oxide (ONO) structure is formed between the floating gate 12 and a control gate 14 supplied to the word line W/L.

Additionally, source/drain regions 15 and 16 are formed as self-aligned on a stacked gate. The flash memory cell stores and deletes data as electric charges are injected and discharged by channel hot carrier injection or by Fowler-Nordheim (F-N) tunneling.

However, when recording and deleting data, the related non-volatile semiconductor memory device temporarily removes electrons of a channel by controlling electrons in a transistor channel so as to turn on and off the transistor. For this, complicated processes for the tunnel oxide layer 11, the floating gate 12 and the ONO layer 14 are required. Also, high-quality materials are required to be durable under a high electric filed. Furthermore, since extremely high signals are necessary to store and delete the data, it becomes hard to drive the whole chip.

SUMMARY

Embodiments relate to a non-volatile semiconductor memory device, and more particularly, to a non-volatile semiconductor memory device effective in simplifying the structure of a transistor requiring complicated fabrication processes, and a fabricating method of the same.

Embodiments relate to a non-volatile semiconductor memory device which includes a semiconductor substrate including a plurality of active regions, gate electrodes formed over the respective active regions of the semiconductor substrate, gate spacers formed over both sides of each of the gate electrodes, common source/drain regions formed on the surface of the semiconductor substrate at both sides of the gate electrode including the gate spacers, an interlayer dielectric formed over the whole surface of a resultant structure including the substrate, gate electrodes, gate spacers and common source/drain regions, and contact plugs penetrating the interlayer dielectric, and connecting the common source/drain regions to a data line, wherein the contact plugs are made from a material which becomes electrically conductive when in contact with light and becomes non-conductive when out of contact with light.

Embodiments relate to a fabrication method for a non-volatile semiconductor memory device includes forming a semiconductor substrate to include a plurality of active regions, forming gate electrodes over the respective active regions of the semiconductor substrate, forming gate spacers over both sides of each of the gate electrodes, forming common source/drain regions on the surface of the semiconductor substrate at both sides of the gate electrode including the gate spacers, forming an interlayer dielectric over the whole surface of the resultant structure, and forming contact plugs penetrating the interlayer dielectric to connect the common source/drain regions to a data line, wherein the contact plugs are formed with a material which becomes electrically conductive when in contact with light and becomes non-conductive when out of contact with light.

DRAWINGS

Figure 1:
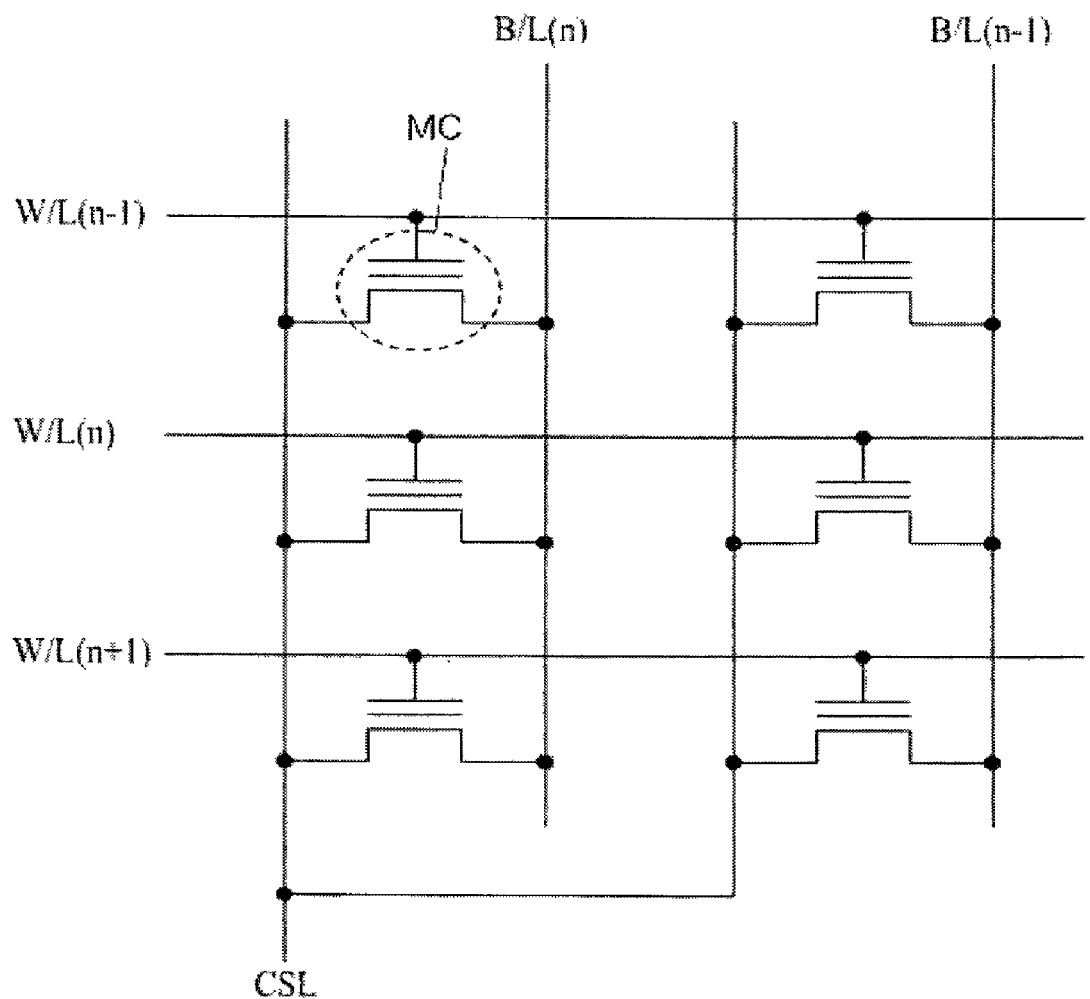
FIG. 1 is an equivalent circuit view of a related flash memory cell array.
Figure 2:
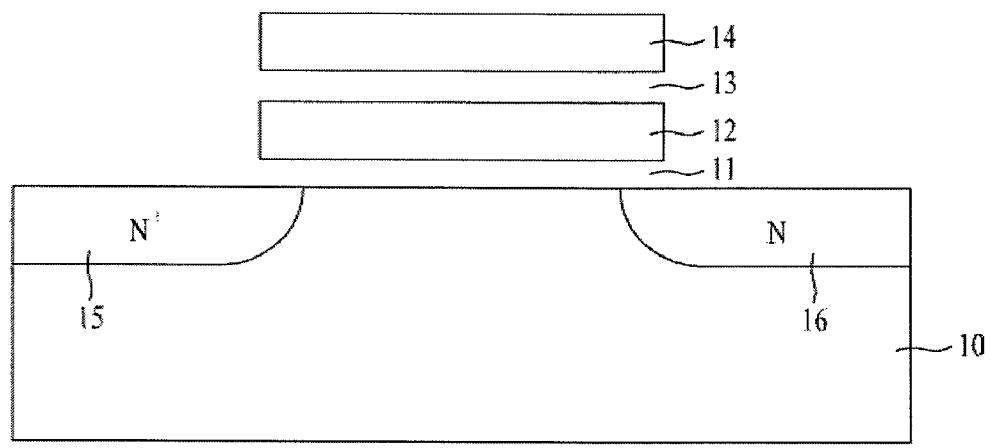
FIG. 2 is a longitudinal sectional view of a unit cell shown in FIG. 1.
Figure 3:
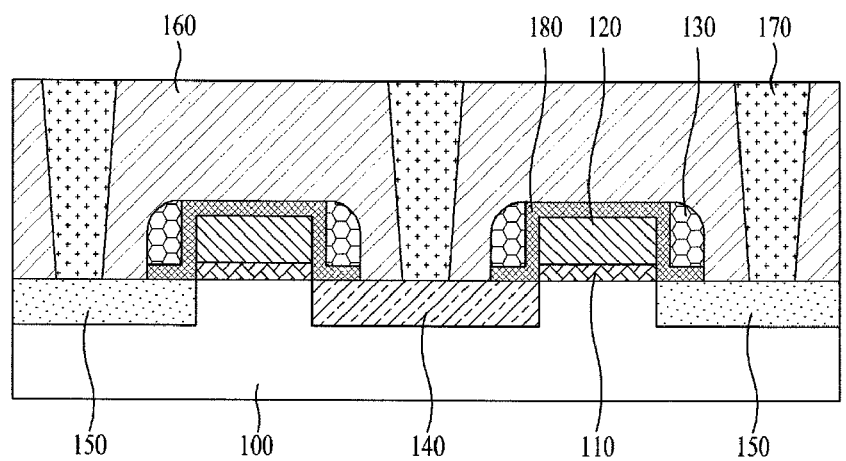

Example FIG. 3 is a sectional view of a non-volatile semiconductor memory device according to embodiments.

Figure 4A:
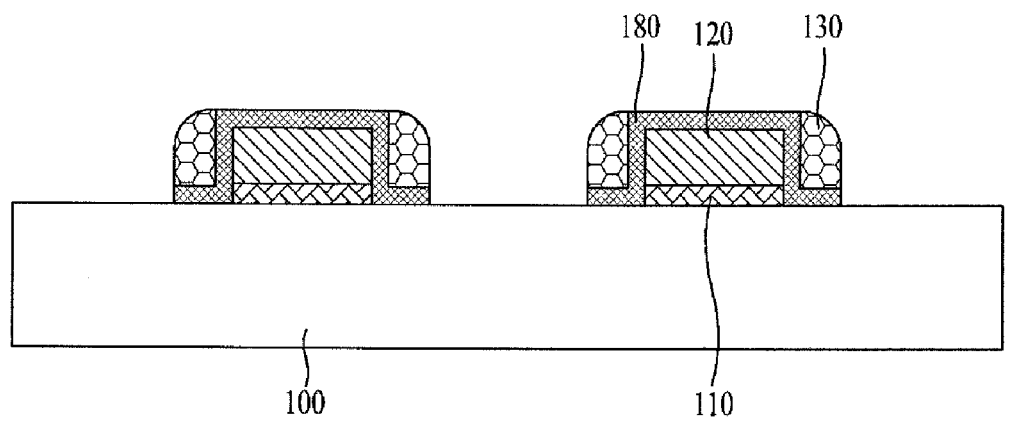
Figure 4B:
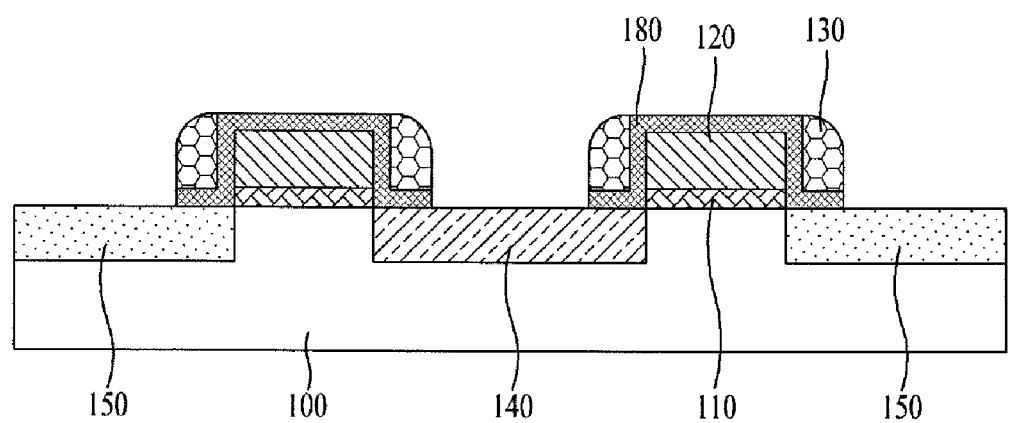
Figure 4C:
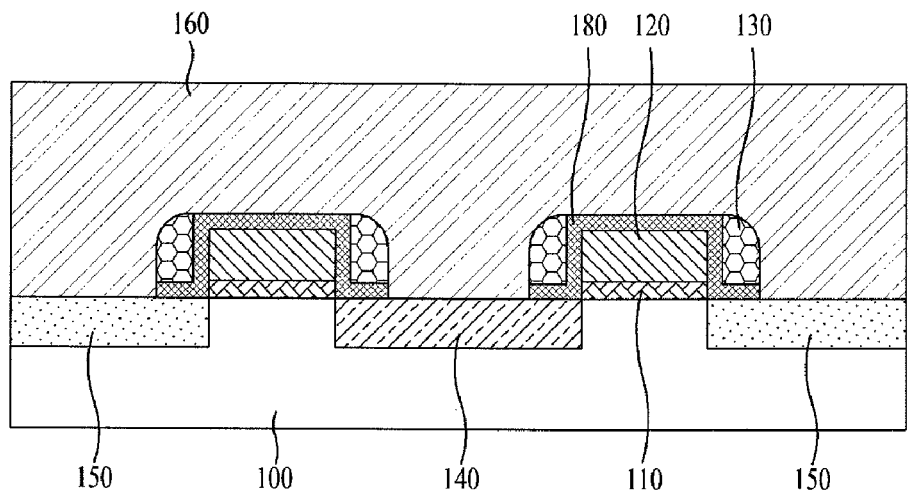
Figure 4D:
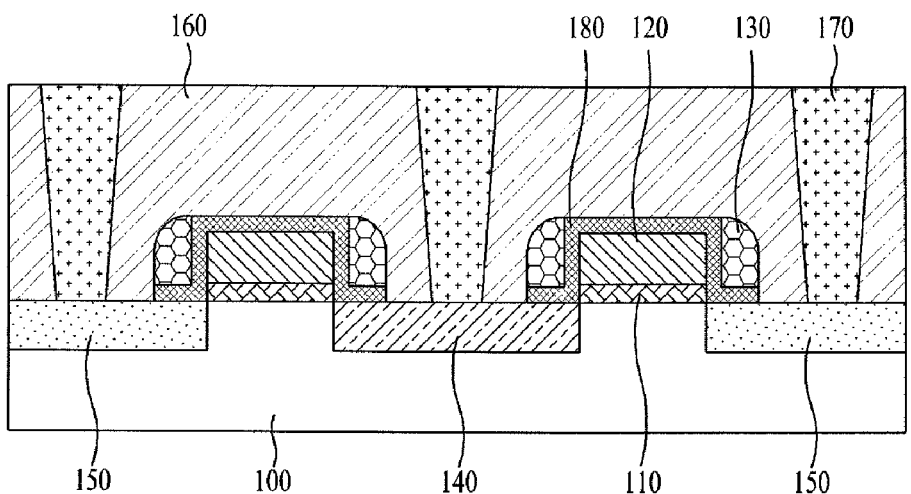

Example FIG. 4A to example FIG. 4D are sectional views illustrating fabrication processes of the non-volatile semiconductor memory device according to embodiments.

DESCRIPTION

Example FIG. 3 is a sectional view of a non-volatile semiconductor memory device according to embodiments. As shown in example FIG. 3, the non-volatile semiconductor memory device may include a plurality of device isolation layers disposed at predetermined intervals on a semiconductor substrate 100, a gate oxide layer 110 and a gate electrode 120 generated by forming and patterning an oxide layer and a poly silicon layer in active regions defined by the device isolation layers, gate spacers 130 formed at lateral sides of each of the gate electrodes 120, common source/drain regions 140 and 150 formed at the active regions disposed on both sides of each gate electrode 120, an interlayer dielectric 160 formed over the whole surface of the semiconductor substrate 100 including the gate electrode 120 and the common source/drain regions 140 and 150, and contact plugs 170 penetrating the interlayer dielectric 160 and thereby connecting the common source/drain regions 140 and 150 with a data line.

A spacer oxide layer 180 may be formed using an oxide to surround and protect the gate electrode 120. The gate spacer 130 may be formed by vapor-depositing and patterning silicon nitride (SiN). The transistor including the gate electrode 120 may be basically maintained in an on state.

The contact plug 170 may be made of arsenic sulfide electrically conductive in response to light (ultraviolet). The arsenic sulfide becomes electrically conductive upon contact with light but becomes non-conductive when out of contact with light. That is, the contact plug 170 may be switched on and off according to light using the principle that the arsenic sulfide turns to an electrically conductive material by light.

Therefore, in the transistor of a non-volatile semiconductor memory device which always maintains the on state by having a channel layer 200 formed by dopant ion implantation, the contact plug 170 is turned on in response to light such that electrons stored in the cells are discharged to the data line, and data is accordingly deleted.

When the contact plug 170 is out of contact with light and therefore turned off, the electrons cannot be discharged and accordingly the data is stored.

Thus, unlike other related non-volatile semiconductor memory devices, the non-volatile semiconductor memory device according to embodiments performs storage and deletion of data by controlling the contact plug 170 connected to the data line, not by the channel of the transistor.

Example FIG. 4A to example FIG. 4D are sectional views illustrating the fabrication processes of the non-volatile semiconductor memory device.

As shown in example FIG. 4A, first, the plurality of device isolation layers may be formed on the semiconductor substrate 100 at predetermined intervals, thereby defining the active regions. The device isolation layers may be arranged parallel with the bit line direction. Next, wells are formed in the semiconductor substrate 100 by well injection.

The oxide layer and the poly silicon layer may be sequentially vapor-deposited in the active regions and then patterned, thereby generating the gate oxide layer 110 and the gate electrode 120. An oxide and SiN layer may be sequentially vapor-deposited over the whole surface of the semiconductor substrate 100 including the gate oxide layer 110 and the gate electrode 120. Patterning may be performed until the SiN on the gate electrode 120 is exposed, thereby forming the spacer oxide layer 180 surrounding the gate electrode 120. The spacer 130 may be formed over both sidewalls of the gate electrode 120 that includes the spacer oxide layer 180.

As show in example FIG. 4B, next, the common source/drain regions 140 and 150 having conductivity may be formed through ion implantation on the surface of the semiconductor substrate 100 on both sides of the gate electrode 120 including the spacer 130.

Referring to example FIG. 4C, next, the interlayer dielectric 160 may be formed over the whole surface of the resultant structure including the gate electrode 120 and the spacer 130. The surface of the interlayer dielectric 160 may then be planarized.

Referring to example FIG. 4D, next, the interlayer dielectric 160 may be selectively etched at positions corresponding to the common source/drain regions 140 and 150, thereby forming contact holes each exposing the common source/drain regions 140 and 150. The contact holes may be filled with a material becoming electrically conductive by light, such as arsenic sulfide, accordingly forming the contact plugs 170 that connect the common source/drain regions 140 and 150 to the data line.

Afterward, generally known following processes may be performed, thereby completing the semiconductor device.

As described above, a non-volatile semiconductor memory device and a fabrication method thereof according to embodiments are capable of achieving a simplified transistor structure by using a light responsive contact plug instead.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
  a semiconductor substrate including a plurality of active regions;
  gate electrodes formed over the respective active regions of the semiconductor substrate;
  gate spacers formed over both sides of each of the gate electrodes;
  common source/drain regions formed on the surface of the semiconductor substrate at both sides of the gate electrode including the gate spacers;
  an interlayer dielectric formed over the whole surface of a resultant structure including the substrate, gate electrodes, gate spacers and common source/drain regions; and
  contact plugs penetrating the interlayer dielectric, wherein the contact plugs are made of a material having an electrical conductivity in response to light.

2. The apparatus of claim 1, including a spacer oxide layer formed of an oxide over the gate electrode to surround the gate electrode.

3. The apparatus of claim 1, wherein the gate spacer comprises silicon nitride.

4. The apparatus of claim 1, wherein the contact plugs are made from arsenic sulfide.

5. The apparatus of claim 1, wherein the contact plug have the electrical conductivity by contact with light and a non-conductivity when out of contact with light.

6. The apparatus of claim 1, wherein the plurality of active regions are defined by a plurality of device isolation layers.

7. An apparatus comprising:
  a semiconductor substrate including a plurality of active regions;
  gate electrodes formed over the respective active regions of the semiconductor substrate;
  gate spacers formed over both sides of each of the gate electrodes;
  common source/drain regions formed on the surface of the semiconductor substrate at both sides of the gate electrode including the gate spacers;
  an interlayer dielectric formed over the whole surface of a resultant structure including the substrate, gate electrodes, gate spacers and common source/drain regions; and
  contact plugs penetrating the interlayer dielectric, wherein the contact plugs are turned on by contact with light and turned off when out of contact with light,
  wherein the contact plugs are made of a material having an electrical conductivity in response to light.

8. The apparatus of claim 7, including a spacer oxide layer formed of an oxide over the gate electrode to surround the gate electrode.

9. The apparatus of claim 7, wherein the gate spacer comprises silicon nitride.

10. The apparatus of claim 7, wherein the contact plugs are made from arsenic sulfide.

* * * * *